United States Patent
Stellman

(10) Patent No.: US 9,435,590 B2
(45) Date of Patent: Sep. 6, 2016

(54) THIN HEAT TRANSFER DEVICE FOR THERMAL MANAGEMENT

(71) Applicant: Microsoft Technology Licensing, LLC, Redmond, WA (US)

(72) Inventor: Jeffrey Taylor Stellman, Seattle, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 83 days.

(21) Appl. No.: 14/247,058

(22) Filed: Apr. 7, 2014

(65) Prior Publication Data
US 2015/0285573 A1 Oct. 8, 2015

(51) Int. Cl.
*F28F 13/00* (2006.01)
*B23P 15/26* (2006.01)
(Continued)

(52) U.S. Cl.
CPC .......... *F28F 13/00* (2013.01); *B23P 15/26* (2013.01); *G06F 1/20* (2013.01); *G06F 1/203* (2013.01); *H01L 23/4093* (2013.01); *H05K 7/20509* (2013.01); *F28F 2013/005* (2013.01); *F28F 2275/08* (2013.01); *F28F 2280/00* (2013.01);
(Continued)

(58) Field of Classification Search
CPC ......... F28F 13/00; B23P 15/00; B23P 15/26; H01L 23/4093; H01L 2924/0002; H01L 23/427; H05K 7/20509; H05K 7/2049; G06F 1/20
USPC ........................... 361/718–719; 257/718–719
See application file for complete search history.

(56) References Cited

U.S. PATENT DOCUMENTS 4,498,530 A 2/1985 Lipschutz
7,298,618 B2 11/2007 Campbell et al.
(Continued)

FOREIGN PATENT DOCUMENTS

EP 2851948 3/2015
WO WO-2013125427 8/2013
WO WO-2013172004 11/2013

OTHER PUBLICATIONS

Walchli, et al., "Self-Contained, Oscillating Flow Liquid Cooling System for Thin Form Factor High Performance Electronics", In Proceedings: Journal of Heat Transfer, vol. 132, Issue 5, May 2010, 9 pages.
(Continued)

*Primary Examiner* — David M Sinclair
*Assistant Examiner* — Robert Brown
(74) *Attorney, Agent, or Firm* — Qudus Olaniran; Judy Yee; Micky Minhas

(57) ABSTRACT

A thin design heat transfer device for thermal management is described herein. The heat transfer device uses a cold plate that is independent or "floating" relative to a spring mechanism employed to generate contact pressure with a heat-generating device. A bridge component associated with the spring mechanism is designed to span over the cold plate and contact the cold plate when the spring deforms, which therefore allows the cold plate to be independent of the spring mechanism. The independence between the cold plate and the spring mechanism enables deformation in the spring mechanism to drive contact pressure while eliminating or reducing corresponding deformation in the cold plate. Consequently, components of the heat transfer device may be made relatively thin and have less stiffness than traditional designs, but still provide acceptable contact pressure and quality for effective thermal management.

20 Claims, 7 Drawing Sheets

(51) Int. Cl.
  *H05K 7/20* (2006.01)
  *G06F 1/20* (2006.01)
  *H01L 23/40* (2006.01)
  *H01L 23/427* (2006.01)

(52) U.S. Cl.
  CPC ...... *H01L 23/427* (2013.01); *H01L 2023/4081* (2013.01); *H01L 2924/0002* (2013.01); *Y10T 29/4935* (2015.01)

(56) References Cited

U.S. PATENT DOCUMENTS

| | | | |
|---|---|---|---|
| 7,414,844 B2 | 8/2008 | Wilson et al. | |
| 7,714,423 B2* | 5/2010 | Reid | H05K 1/021 257/685 |
| 8,094,453 B2 | 1/2012 | Campbell et al. | |
| 8,422,218 B2 | 4/2013 | Fried et al. | |
| 8,934,247 B2* | 1/2015 | Chen | H01L 23/40 165/80.3 |
| 2003/0058624 A1* | 3/2003 | Deeney | H05K 7/1061 361/736 |
| 2006/0087816 A1* | 4/2006 | Ewes | F28F 3/02 361/704 |
| 2009/0101318 A1* | 4/2009 | Ma | H01L 23/4006 165/104.33 |
| 2009/0146294 A1 | 6/2009 | Hillman et al. | |
| 2011/0110044 A1* | 5/2011 | Wei | H01L 23/36 361/704 |
| 2011/0114294 A1* | 5/2011 | Degner | H01L 23/4006 165/104.26 |
| 2013/0168068 A1 | 7/2013 | Huang et al. | |
| 2013/0186596 A1* | 7/2013 | Rubenstein | G06F 1/206 165/104.17 |
| 2013/0343005 A1 | 12/2013 | David et al. | |
| 2014/0360701 A1* | 12/2014 | Aoki | H01L 23/427 165/104.21 |
| 2015/0043167 A1* | 2/2015 | Guenin | H01L 23/3672 361/719 |
| 2015/0131229 A1* | 5/2015 | Matsunaga | H05K 7/20336 361/700 |

OTHER PUBLICATIONS

"International Search Report and Written Opinion", Application No. PCT/US2015/023750, Jun. 30, 2015, 12 Pages.

\* cited by examiner

600

602
Arrange a spring mechanism for a heat transfer device having a cutout that matches a footprint of a cold plate for the heat transfer device

604
Connect a heat-expelling device to both the spring mechanism and the cold plate such that the cold plate is positioned within the cutout formed in the spring mechanism but not attached directly to the spring mechanism

606
Fasten a spring bridge to the spring mechanism such that the spring bridge spans the cold plate and contacts the cold plate responsive to deformation of the spring mechanism, the spring bridge being detached from the cold plate and the heat-expelling device

Fig. 6

THIN HEAT TRANSFER DEVICE FOR THERMAL MANAGEMENT

SUMMARY

A thin design heat transfer device for thermal management is described herein. The heat transfer device uses a cold plate for heat transfer that is independent or "floating" relative to a spring mechanism employed to generate contact pressure for contact with a heat-generating device (e.g., CPU). A bridge component associated with the spring mechanism is designed to span over the cold plate and contact the cold plate when the spring deforms, which therefore allows the cold plate to be independent of the spring mechanism. The bridge design may be adapted to selectively vary contact force and contact locations to achieve optimal conditions for different thermal management scenarios. The independence between the cold plate and the spring mechanism enables deformation in the spring mechanism to drive contact pressure while eliminating or reducing corresponding deformation in the cold plate. Consequently, components of the heat transfer device may be made relatively thin and have less stiffness than traditional designs, but still provides acceptable contact pressure and quality for effective thermal management.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

FIG. 6 is a flow diagram depicting a procedure in an example implementation in which a heat transfer device is assembled.

DETAILED DESCRIPTION

Overview

Computing devices are available in an ever increasing variety of configurations. For example, computing devices were traditionally limited to relatively large form factors due to the size of components of the computing devices, such as traditional desktop computers. As component size has decreased, the configurations of the computing devices have expanded from traditional desktop computers to laptop computers, mobile phones (e.g., "smartphones"), tablet computers, gaming devices, and so on.

However, considerations such as heat transfer and noise may become increasingly problematic when confronted with these different thin form configurations. The thinness of some devices may adversely affect tolerances for traditional thermal management devices and limit the amount of space (area and volume) available for both thermal management systems and components used to cause engagement of the systems with heat generating components to achieve effective heat transfer. Device thinness may adversely affect the stiffness, contact pressure, and quality of contact that is attained by traditional configurations of heat transfer devices. Therefore, design of heat transfer devices presents a considerable challenge particularly in relation to thin form devices.

A thin design heat transfer device for thermal management is described herein. The heat transfer device uses a cold plate for heat transfer that is independent or "floating" relative to a spring mechanism employed to generate contact pressure for contact with a heat-generating device (e.g., CPU). A bridge component associated with the spring mechanism is designed to span over the cold plate and contact the cold plate when the spring deforms, which therefore allows the cold plate to be independent of the spring mechanism. The bridge design may be adapted to selectively vary contact force and contact locations to achieve optimal conditions for different thermal management scenarios. The independence between the cold plate and the spring mechanism enables deformation in the spring mechanism to drive contact pressure while eliminating or reducing corresponding deformation in the cold plate. Consequently, components of the heat transfer device may be made relatively thin and have less stiffness than traditional designs, but still provides acceptable contact pressure and quality for effective thermal management.

In the following discussion, an example environment is first described that may employ the heat transfer techniques described herein. Example procedures are then described which may be performed in the example environment as well as other environments. Consequently, performance of the example procedures is not limited to the example environment and the example environment is not limited to performance of the example procedures.

Example Operating Environment

Figure 1:
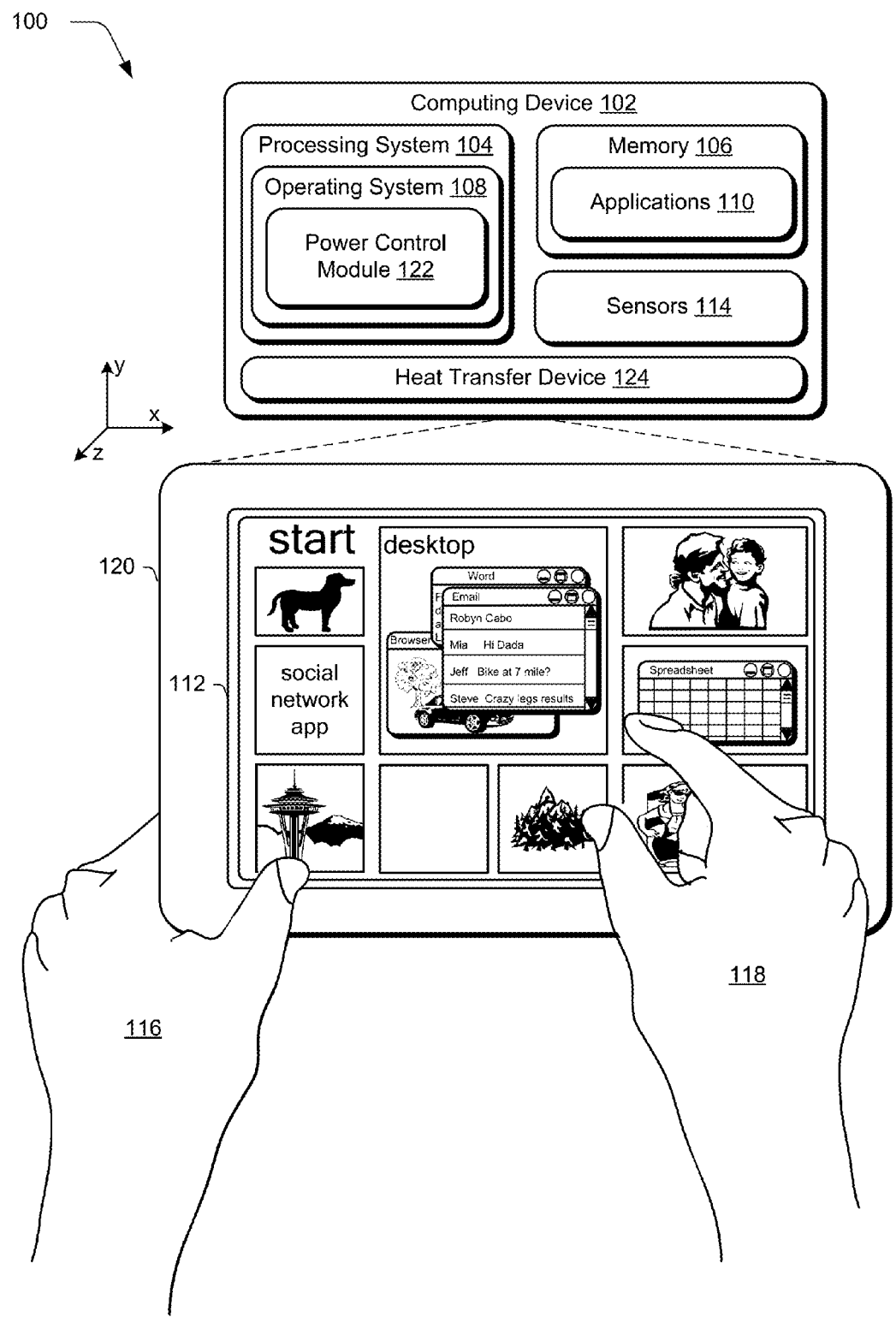
FIG. 1 is an illustration of an environment in an example implementation that is operable to employ a heat transfer device in accordance with one or more implementations.

FIG. 1 is an illustration of an environment 100 in an example implementation that is operable to employ techniques described herein. The illustrated environment 100 includes a computing device 102 having a processing system 104 and a computer-readable storage medium that is illustrated as a memory 106 although other confirmations are also contemplated as further described below.

The computing device 102 may be configured in a variety of ways. For example, a computing device may be configured as a computer that is capable of communicating over a network, such as a desktop computer, a mobile station, an entertainment appliance, a set-top box communicatively coupled to a display device, a wireless phone, a game console, and so forth. Thus, the computing device 102 may range from full resource devices with substantial memory and processor resources (e.g., personal computers, game consoles) to a low-resource device with limited memory and/or processing resources (e.g., traditional set-top boxes, hand-held game consoles). Additionally, although a single computing device 102 is shown, the computing device 102 may be representative of a plurality of different devices, such as multiple servers utilized by a business to perform operations such as by a web service, a remote control and set-top box combination, an image capture device and a game console configured to capture gestures, and so on. Further discussion of different configurations that may be assumed by the computing device may be found in relation to FIG. 7.

The computing device 102 is further illustrated as including an operating system 108. The operating system 108 is configured to abstract underlying functionality of the computing device 102 to applications 110 that are executable on the computing device 102. For example, the operating system 108 may abstract the processing system 104, memory 106, network, and/or display device 112 functionality of the computing device 102 such that the applications 110 may be written without knowing "how" this underlying functionality is implemented. The application 110, for instance, may provide data to the operating system 108 to be rendered and displayed by the display device 112 without understanding how this rendering will be performed. The operating system 108 may also represent a variety of other functionality, such as to manage a file system and user interface that is navigable by a user of the computing device 102.

The computing device 102 may support a variety of different interactions. For example, the computing device 102 may include one or more hardware devices that are manipulable by a user to interact with the device, such as a keyboard, cursor control device (e.g., mouse), and so on. The computing device 102 may also support gestures, which may be detected in a variety of ways. The computing device 102, for instance, may support touch gestures that are detected using touch functionality of the computing device 102. The sensors 114, for instance, may be configured to provide touchscreen functionality in conjunction with the display device 112, alone as part of a track pad, and so on. An example of this is illustrated in FIG. 1 in which first and second hands 116, 118 of a user are illustrated. The first hand 116 of the user is shown as holding a housing 120 of the computing device 102. The second hand 118 of the user is illustrated as providing one or more inputs that are detected using touchscreen functionality of the display device 112 to perform an operation, such as to make a swipe gesture to pan through representations of applications in the start menu of the operating system 108 as illustrated.

Thus, recognition of the inputs may be leveraged to interact with a user interface output by the computing device 102, such as to interact with a game, an application, browse the internet, change one or more settings of the computing device 102, and so forth. The sensors 114 may also be configured to support a natural user interface (NUI) that may recognize interactions that may not involve touch. For example, the sensors 114 may be configured to detect inputs without having a user touch a particular device, such as to recognize audio inputs through use of a microphone. For instance, the sensors 114 may include a microphone to support voice recognition to recognize particular utterances (e.g., a spoken command) as well as to recognize a particular user that provided the utterances.

In another example, the sensors 114 may be configured to detect movement of the computing device 102 in one or more dimensions, such as the x, y, and z dimensions as illustrated, through use of accelerometers, gyroscopes, inertial measurement units (IMUs), magnetometers, and so on. This movement may be recognized in whole in part as part of a definition of a gesture. For example, movement of the computing device 102 in the z axis may be used to zoom in a user interface displayed on the display device 112, rotation through the x axis may be used to steer a car in a video game, and so on. Thus, in this example the computing device 102 may be moved through a variety of different orientations to support interaction with the device.

In a further example, the sensors 114 that may be configured to recognize gestures, presented objects, images, and so on through implementations as one or more cameras. The cameras, for instance, may be configured to include multiple lenses so that different perspectives may be captured and thus determine depth. The different perspectives, for instance, may be used to determine a relative distance from the sensors 114 and thus a change in the relative distance. The different perspectives may be leveraged by the computing device 102 as depth perception. The images may also be leveraged by the computing device 102 to support a variety of other functionality, such as techniques to identify particular users (e.g., through facial recognition), objects, and so on. It should also be noted that the sensors 114 may also support detection of movement as described above in one or more of the x, y, or z axes through implementation as a camera.

The computing device 102 is further illustrated as including a power control module 122. The power control module 122 is representative of functionality to cause a device to enter different power consumption states. The processing system 104, for instance, may be configured to support a low power state in which processing resources are lessened and power consumption of the processing system 104 is also lessened. Thus, the processing system 104 may be configured to conserve resources (e.g., from a battery) while in this low power state.

During operation, the processing system 104 acts as a heat-generating device that may produce heat levels in excess of "safe" limits if left unmitigated. As such thermal limits are approached, the computing device may have to be shutdown and/or operation of the processing system 104 may be throttled, which adversely affects performance. Accordingly, computing devices may include some type of thermal management system to manage heat-generating device. As mentioned, however, the push to make thinner and thinner devices has made design of thermal management systems increasingly more difficult because the space (area and volume) available for include thermal management components is compressed in small form factor device. This in turn may make it difficult to employ components (e.g., heat transfer plates) having sufficient thickens for stiffness.

As a result, performance of traditional thermal management systems may suffer due to reductions in contact pressure and quality of contact (e.g., contact area) that are attainable with thinner component.

In accordance with principles discussed in this document, the computing device 102 includes a heat transfer device 124 used for thermal management that employs a thin design relative to traditional systems. As discussed in the details section that follows, the heat transfer device 124 makes uses of a cold plate for heat transfer that is independent or "floating" relative to a spring mechanism employed to generate contact pressure for contact of the heat transfer device 124 with a heat-generating device. A bridge component associated with the spring mechanism is designed to span over the cold plate and contact the cold plate when the spring deforms, which therefore allows the cold plate to be independent of the spring mechanism. Components of the heat transfer device 124 may be made relatively thinner and have less stiffness than traditional designs, but still provide acceptable contact pressure and quality for effective thermal management.

Having considered an example operating environment, consider now a discussion of example details of a heat transfer device in accordance with one or more implementations.

Heat Transfer Device Implementation Details

Figure 2:
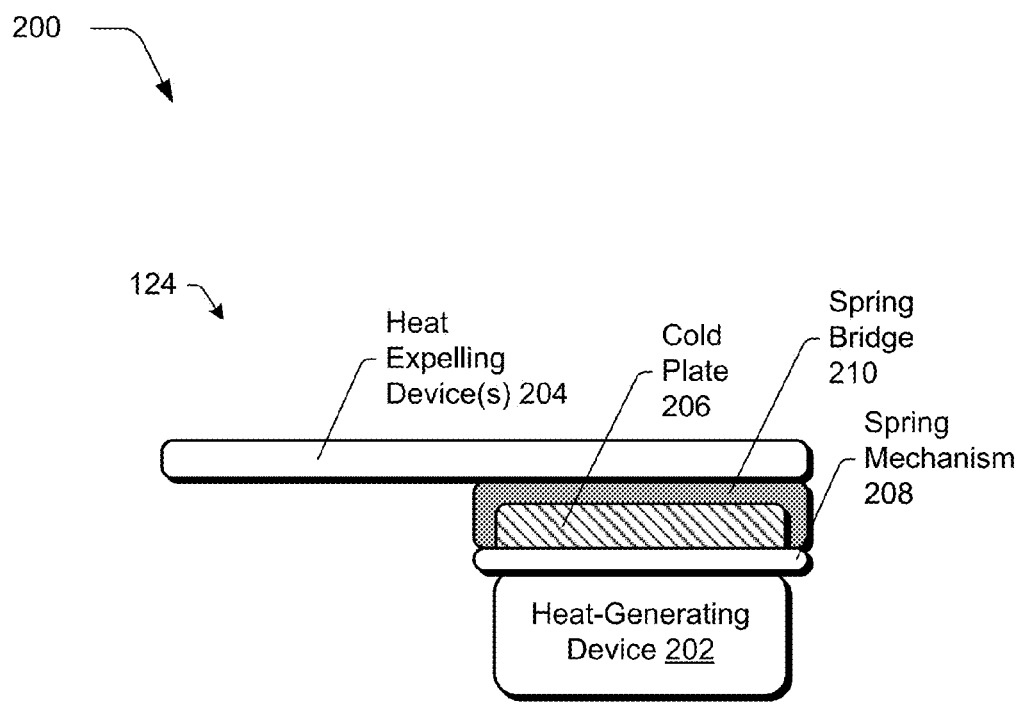
FIG. 2 depicts an example implementation of a heat transfer device of FIG. 1.

FIG. 2 depicts generally at 200 an example implementation of a heat transfer device 124 of FIG. 1 that employs a thin design and components as discussed above and below. In particular, the heat transfer device 124 is illustrated as being arranged proximal to a heat-generating device 202, such as a processing system 104 as described in relation to FIG. 1 although other heat-generating devices are also contemplated such as other electrical devices of a computing device or other apparatus. The arrangement of the heat transfer device 124 relative to the heat-generating device 202 enables engagement of the heat transfer device 124 with the heat-generating device 202 for thermal management.

The heat transfer device 124 in this example includes one or more heat-expelling devices 204. The heat-expelling device 204 is configured to transfer heat away from the heat-generating device 202 through use of thermal conductivity, phase transition, cooling fins, evaporation, heat sinks, and other techniques to convey heat away from the device. For example, the heat-expelling device 204 may be in the form of one or more heat pipes that are configured as enclosed tubes of thermally conductive material, e.g., a metal such as copper, and thus may conduct heat away from the heat-generating device 202 using thermal conductivity. Heat may be drawn out to vents of the device or other exhaust mechanisms. In addition or alternatively to using heat pipes, other types of techniques and components may be employed to draw heat away from the heat-generating device such as phase transition devices, vapor chambers, cooling fins, a heat sink, and so forth. Generally, any highly conductive device and/or materials may be used as a heat transfer mechanism.

The heat transfer device 124 in the depicted example additionally includes a cold plate 206, spring mechanism 208, and a spring bridge 210 that may be arranged and operated in various ways described above and below. The example heat pipes may be arranged to being in contact with the cold plate 206 and may also be secured to the spring mechanism 208 in any suitable way. Generally, the spring mechanism 208 is designed to deform to generate contact pressure between the heat transfer device 124 and the heat-generating device 202. In one or more implementation the spring mechanism is configured as a plate that deforms in response to generated heat, which creates force that causes engagement of the heat transfer device 124 with the heat-generating device 202. The spring mechanism may be a thin sheet metal plate. Other types of spring mechanisms are also contemplated. In one or more implementations the spring mechanism 208 is soldered, mechanically fastened, or otherwise secured to the heat expelling device(s) 204.

The spring bridge 210 is configured to span over the cold plate and cause the transfer of the contact pressure from the spring mechanism to the cold plate. The spring bridge 210 may be secured to the spring mechanism using fasteners, soldering, lamination or other suitable techniques for securing the components one to another. Alternatively, the spring bridge 210 may be formed together with the spring mechanism 208 from the same piece of material. However, the spring bridge 210 is not attached to the cold plate 206 or the heat-expelling device(s) 204. Likewise, the spring mechanism 208 is not attached to the cold plate 206. In other words, the cold plate 206 is independent or "floating" relative to the spring mechanism 208 and the spring bridge 210. As such, deformation of the spring mechanism 208 does not cause corresponding deformation of the cold plate 206 to the extent that would occur if the cold plate was integrated with or fixedly attached to the spring mechanism 208. Accordingly, a relatively thin cold plate 206 may act in manner comparable to thicker, stiffer plates used in traditional designs.

In operation, contact pressure created by the spring mechanism 208 may be transferred to the cold plate 206 and drive the cold plate into contact with the heat-generating device 202. The cold plate 206 is designed as a heat transfer surface of the heat transfer device 124 for heat exchange with a heat-generating device 202 for which the heat transfer device is configured to perform thermal management. Little or no deformation of the cold plate may occur due to the contact pressure, which enables the device to attain uniform pressure and/or optimal contact area with the heat-generating device. The cold plate may be configured to have a footprint that is slightly larger than a surface of the heat-generating device to which the cold plate is designed to engage. As such, the cold plate overlaps the surface, which ensures contact across the entire surface of the heat-generating device. The cold plate 206 may also be in contact with the heat pipe(s) or other heat-expelling devices such that heat is transferred from the device to the cold plate and then away from the device. In one or more implementations the cold plate is soldered, fastened, or otherwise secured to the heat-expelling devices, but as mentioned floats relative the spring components. The cold plate 206 may be configured as a thin metal conductive plate, such as a plate of copper or other highly conductive material. In one or more implementations, the cold plate 206 may have a thickness of approximately 0.2 millimeters or less. Other components of the heat transfer device 124 may also be configured to have very thin profiles with thickness in the range of approximately 0.5 millimeters or less. Accordingly, the overall thickness of a heat transfer device 124 formed in the manner discussed herein may also be approximately 0.5 millimeters or less.

Figure 3:
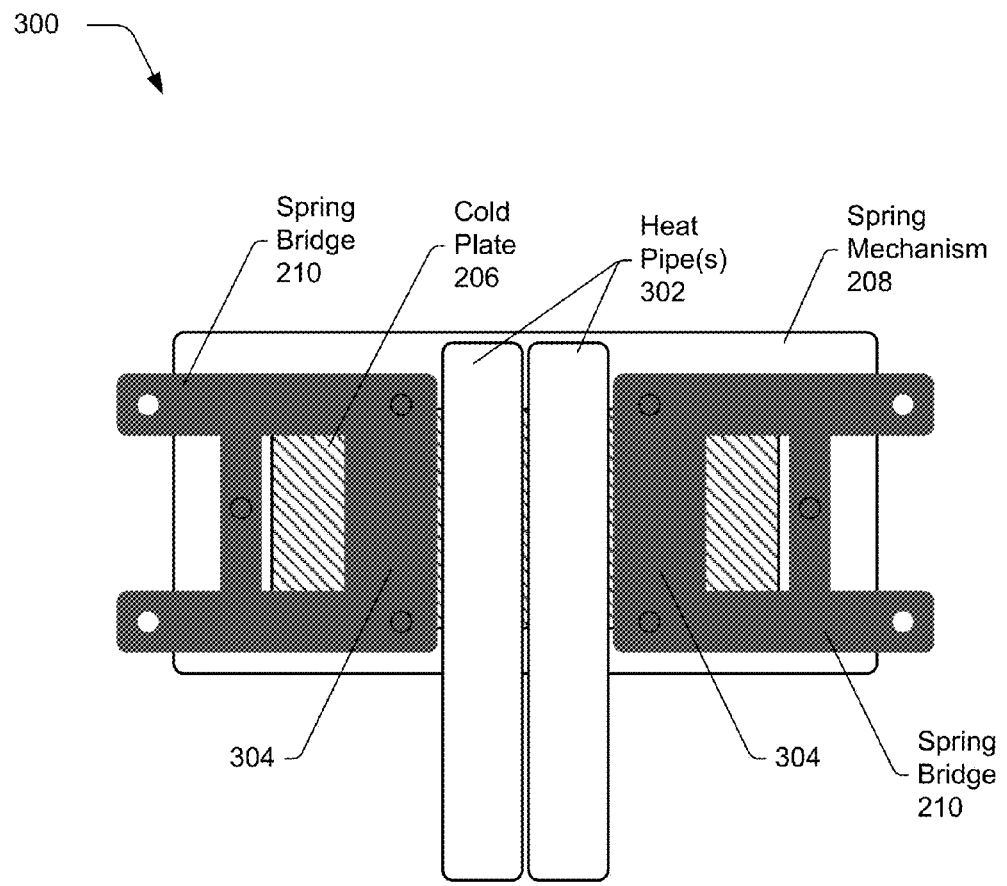
FIG. 3 depicts a top view of an example implementation of a heat transfer device of FIGS. 1 and 2 that employs a spring mechanism with a spring bridge and floating cold plate.

FIG. 3 depicts generally at 300 a top view of an example implementation of a heat transfer device of FIGS. 1 and 2 that employs a spring mechanism with a spring bridge and a floating cold plate. Note that in the depicted example the device includes a pair of heat pipes 302 as the heat-expelling devices 302 and a pair of spring bridges 210. The pair of spring bridges 208 may be secured to the spring mechanism 208 on opposing ends as depicted. The cold plate 206 is arranged under the spring bridges 210 and heat pipes 302. As mentioned, the cold plate may be secured to the pipes, but is floating with respect to the spring mechanism and spring bridge(s).

In one or more implementations, the two heat pipes are soldered directly to the cold plate 206 and may also be substantially centered over the spring mechanism 210. When assembled into a computing device, the heat transfer device 124 may be positioned directly on top of the primary heat source, which allows for optimal heat transfer from a heat-generating device 202.

As mentioned, the spring mechanism 208 may be configured as a thin sheet metal plate. The footprint of the spring mechanism 208 may be slightly larger than the footprint of the heat-generating device 202. There is also a cutout in this plate that substantially matches the footprint of the cold plate. The spring mechanism 208 may be soldered directly to the heat pipe(s) 302 or other heat-expelling devices and in line with the cold plate 206. This spring mechanism 208 is free to bend without imparting substantial bending forces upon or causing deformation in the cold plate 206. Features may optionally be added to the spring plate to increase the stiffness of the spring mechanism, but the requisite stiffness for thermal contact is primarily achieved by the design of the spring bridges 210.

The spring bridges 210 are attached to the spring mechanism 208 but not the cold plate 206 or the heat pipes 302. The spring bridges 210 span the cold plate and are intended to contact the cold plate as the spring mechanism 208 deforms. The spring bridges may be arranged at and/or fastened to opposing ends of the spring mechanism such that both of said spring bridges operate to apply the contact pressure to the cold plate responsive to deformation of the spring mechanism.

The use of spring bridges 210 as discussed herein enables a designer to selectively vary the location of the contact force for different devices, systems, and thermal management scenarios. For example, the location of contact may be varied by changing the width of the bridge portions 304 of the spring bridges that span the cold plate. Thus, an arrangement of the spring bridges 210 may be selected to apply force in a location that creates uniform pressure and good contact area, and is therefore optimal for heat transfer. This design also enables positioning of the heat transfer device directly on top of a CPU, processing core, or other heat generating device that is being managed. In addition or alternatively, amounts of contact pressure may be controlled by varying the size of a gap between the cold plate and the bridge portions 304. A smaller gap increases the total stiffness of the device and causes application of greater pressure to be applied relative to designs with larger gaps. Thus, the contact pressure increases as the gap decreases and decreases as the gap increases. Accordingly, the gap may be varied to control the contact pressure for different devices, systems, and thermal management scenarios.

Figure 4A:
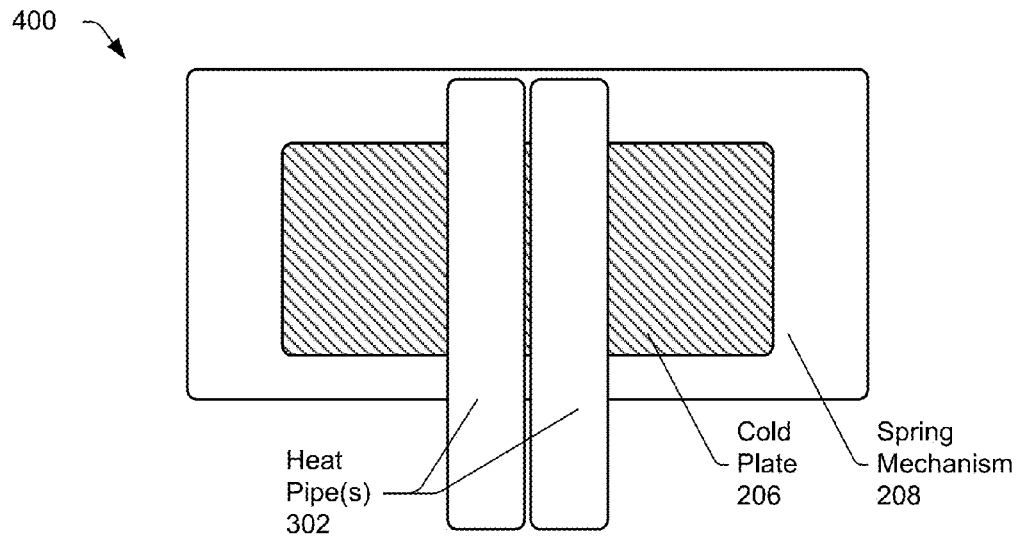
FIG. 4A depicts a top view of the example heat transfer device of FIG. 3 without showing the spring bridge.
Figure 4B:
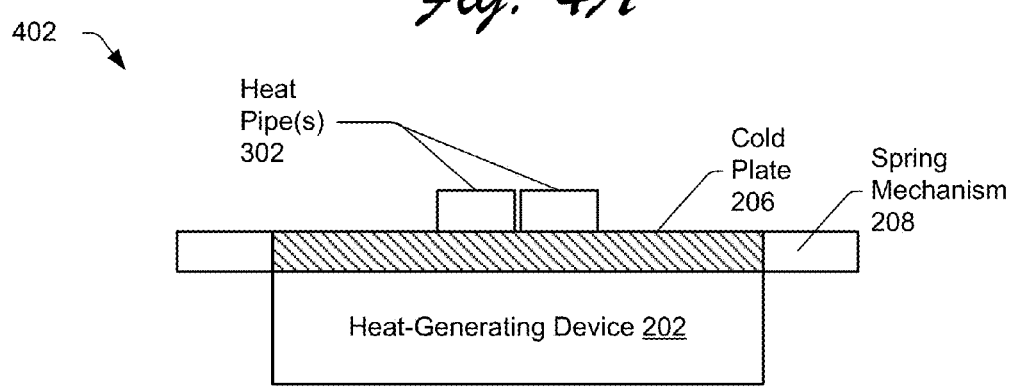
FIG. 4B depicts a cross-sectional side view of the example heat transfer device depicted in FIG. 4A arranged with a heat-generating device.
Figure 4C:
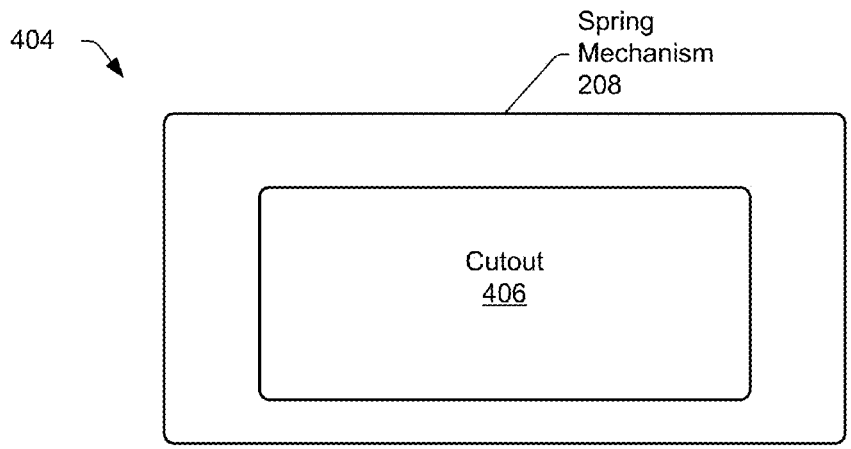
FIG. 4C depicts a top view of the example spring mechanism of the heat transfer device depicted in FIG. 4A.

Some additional views of the example heat transfer device are depicted in FIGS. 4 and 5 to illustrate some additional aspects of the components and techniques described herein. In particular, FIG. 4A depicts generally at 400 a top view of the example heat transfer device of FIG. 3 without showing the spring bridge. FIG. 4B depicts generally at 402 a cross-sectional side view of the example heat transfer device depicted in FIG. 4A arranged with a heat-generating device. FIG. 4C depicts generally at 404 a top view of the example spring mechanism 208 of the heat transfer device depicted in FIG. 4A showing that cutout 406 is formed. These views illustrate that the cold plate 206 extends under the heat pipes across the heat transfer device as represented in FIG. 4A.

Further, the cold plate 206 is positioned within the cutout 406 formed in the spring mechanism 208 that is illustrated in FIG. 4C. The cold plate 206 and spring mechanism 208 are arranged in line with each other. FIG. 4B additionally depicts that the cold plate 206 may extend down through the cutout 406 to contact the heat-generating device 202 in response to deformation of the spring mechanism 208. This may occur under the influence of contact pressure that is applied via one or more spring bridges (not shown) in the manner previously described.

Figure 5A:
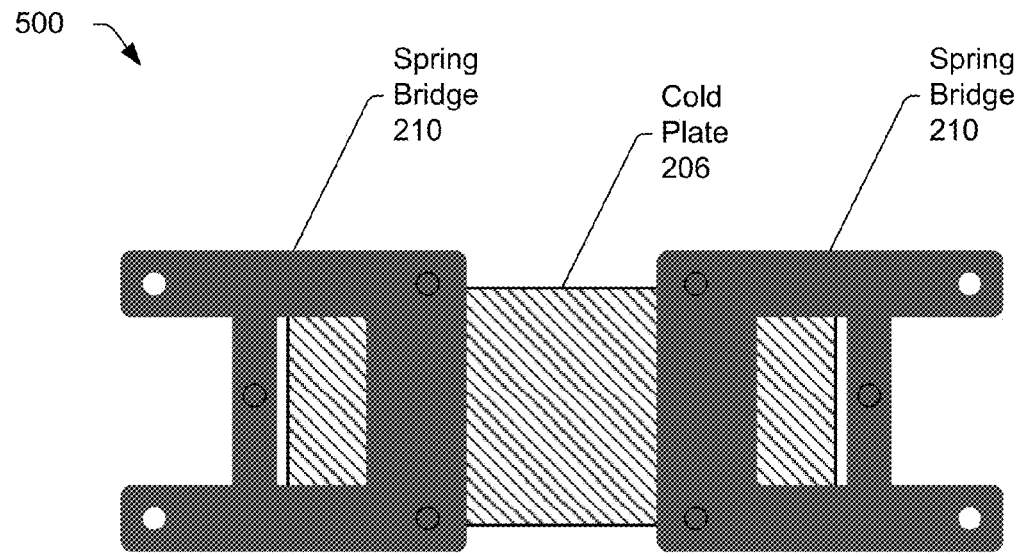
FIG. 5A depicts a top view of the example heat transfer device of FIG. 3 without showing the spring mechanism and heat pipe(s).
Figure 5B:
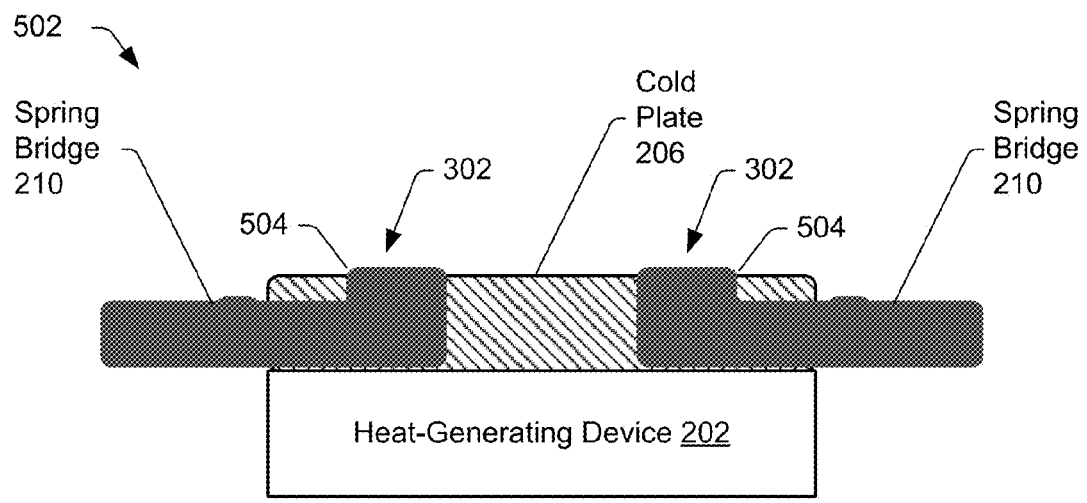
FIG. 5B depicts a side view of the example heat transfer device depicted in FIG. 5A arranged with a heat-generating device.

FIG. 5A depicts generally at 500 a top view of the example heat transfer device of FIG. 3 without showing the spring mechanism and heat pipe(s). FIG. 5B depicts generally at 502 a side view of the example heat transfer device depicted in FIG. 5A arranged with a heat-generating device. These views illustrate the spanning of the spring bridges 210 over the cold plate 206. As noted, gaps 504 may exist between the spring bridges 210 and the cold plate 206 under the bridge portions 304. These gaps may be controlled to vary the contact pressure applied to the cold plate when the spring mechanism deforms. Further the width of the bridge portions 304 may be controlled to change the location and/or uniformity of the applied contact pressure.

Example Procedure

FIG. 6 depicts a procedure 600 in an example implementation in which a heat transfer device to transfer heat away from a heat-generating device is assembled. The following discussion describes techniques that may be used to produce and assemble components of heat transfer device as previously described that may employed for thermal management of various systems and devices. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference may be made to the operating environment 100 of FIG. 1 and the examples of FIGS. 2-5, respectively.

A spring mechanism for a heat transfer device having a cutout that matches a footprint of a cold plate for the heat transfer device arranged (block 602). The arrangement may involve producing the spring mechanism and/or positioning of the spring mechanism for assembly of a heat transfer device. For example, a spring mechanism 208 as discussed above and depicted in FIG. 4C may be formed in various ways. As mentioned the spring mechanism 208 may be configured as thin metal plate or other type of spring that may deform or bend. The deformation provides force for the heat transfer device that creates the contact pressure to attach the device to a heat-generating device (e.g., bring the heat transfer device into thermal contact with the heat-generating device). In particular, the spring mechanism is configured to drive a cold plate 206 as described above into contact with the heat-generating device 202 for effective heat transfer away from the device. To do so, the spring mechanism 208 is formed to include a cutout 406 that matches a footprint of the cold plate. The cutout 406 may be formed in any suitable way, examples of which include die cutting, laser cutting, stamping, molding, chemical etching, and so forth. The cold plate 206 is formed as a thin conductive plate such as a plate of copper or other highly conductive material. The cold plate 206 is configured to be arranged within the cutout 406 in an assembled heat transfer device 124. This allows the cold plate 206 to contact an underlying heat generating device to which the heat transfer device 124 is attached through the cutout 406. The spring mechanism therefore is adapted to receive the cold plate within the cutout and may be arranged with the cold plate during assembly such that the cold plate is inserted into the cutout in-line with the spring mechanism.

A heat-expelling device is connected to both the spring mechanism and the cold plate, such that the cold plate is positioned within the cutout formed in the spring mechanism but not attached directly to the spring mechanism (block 604). A variety of different types of heat-expelling devices 204 may be employed in a heat transfer device assembly, one example of which is the heat pipes 302 described in the preceding discussion. When assembled, the heat-expelling device may be connected by soldering, fusion, mechanical fasteners, adhesives, welding or other attachment techniques to both the spring mechanism 208 and the cold plate 206. In order to allow the cold plate 206 freedom of movement through the cutout 406 of the spring mechanism 208, the cold plate is not attached directly to the spring mechanism 208.

Additionally, a spring bridge is fastened to the spring mechanism such that the spring bridge spans the cold plate and contacts the cold plate responsive to deformation of the spring mechanism, the spring bridge being detached from the cold plate and the heat expelling device (block 602). For example, a spring bridge 210 configured in the manner described in relation to the preceding examples may be fastened to the spring mechanism 208 in various ways. Example fastening techniques include but are not limited to soldering, fusion, mechanical fasteners, adhesives, welding, and so forth. The spring bridge 210 remains detached from the cold plate 206 and the heat expelling device 204. Thus, when assembled, a bridge portion 304 of the spring bridge 210 spans over the cold plate 206 and forms a gap 504 in between bridge portion 304 and the cold plate 206. Then, when the spring mechanism deforms, the spring bridge 210 is forced into contact with the cold plate 206 (e.g., the gap closes) which produces the contact pressure to engage the cold plate with the heat-generating device 202. A single spring bridge 210 may be employed although assemblies having more than one spring bridge are also contemplated, such as in the example of FIG. 3

Accordingly, an assembled heat transfer device 124 may be produced that includes a spring mechanism 208 having a spring bridge 210 fastened thereto which spans over a cold plate 206 situated within a cutout 402 of the spring mechanism 208. A heat-expelling device 204 is connected to both the cold plate 206 and spring mechanism 208. However, the cold plate 206 is able to move independently of the spring mechanism 208 or "float" within the cutout such that the cold plate 206 does not deform substantially when spring mechanism 208 deforms. Instead, the floating cold plate 206 may be driven through the cutout into contact with a heat-generating device 202 in response to deformation of the spring mechanism.

One or more assembled heat transfer devices 124 may be employed in various computing devices and in various configurations for thermal management of many different kinds of heat-generating devices 202. Accordingly, one or more heat transfer devices may be installed in a computing device 102 as represented in FIG. 1 for thermal management of one or more components of the computing device including but not limited to the example processing system 104. For example, an individual heat transfer device 124 as described herein may be associated with each of multiple processing cores of a device. In addition or alternatively, heat transfer devices 124 as described may be installed for thermal management of other heat-generating devices 202 such as for a power supply unit, battery, microprocessor, graphics processor, and so forth.

Example System and Device

Figure 7:
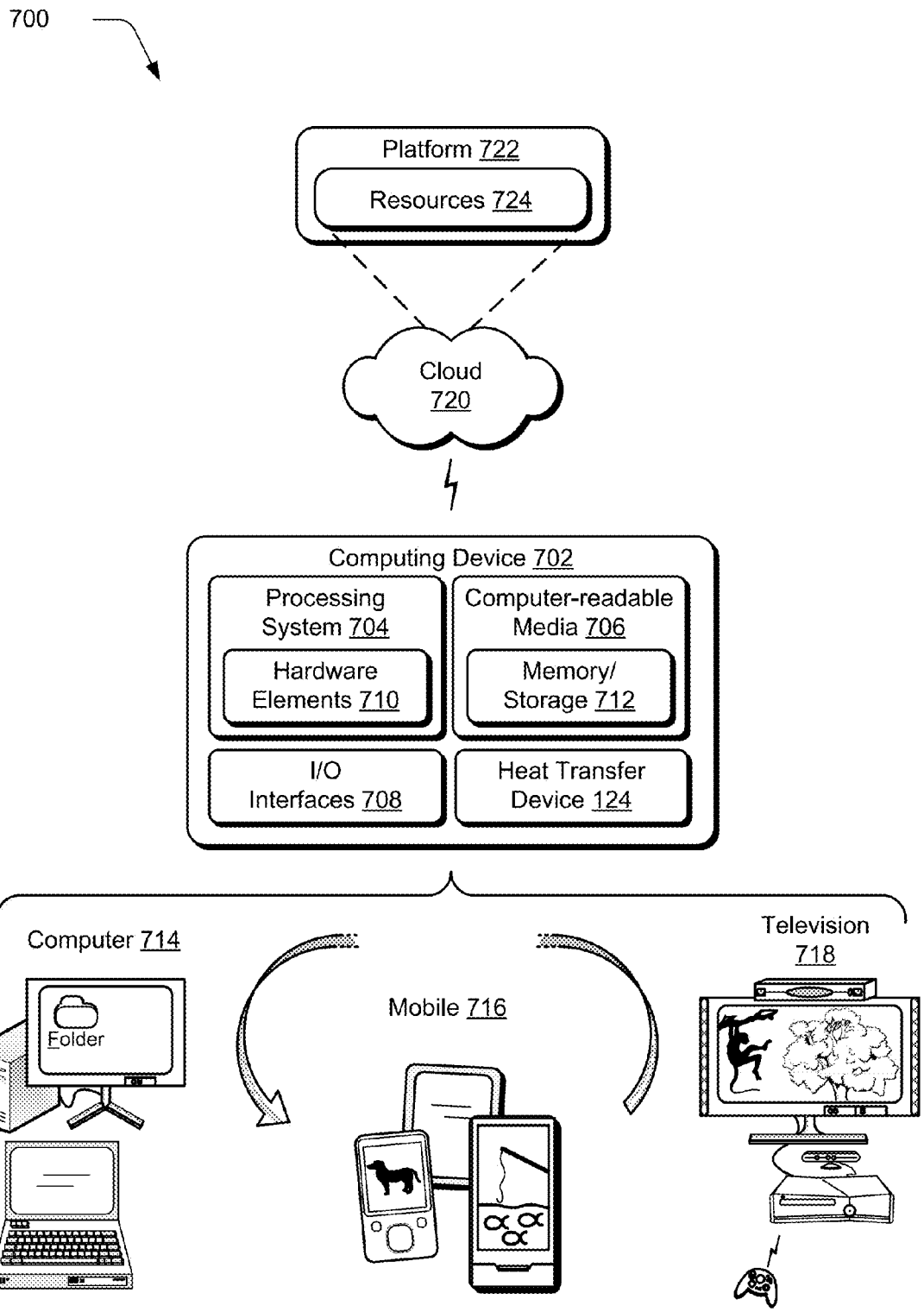
FIG. 7 illustrates an example system including various components of an example device that can be implemented as any type of computing device as described with reference to FIGS. 1-6 to implement embodiments of the techniques described herein.

FIG. 7 illustrates an example system generally at 700 that includes an example computing device 702 that is representative of one or more computing systems and/or devices that may implement the various techniques described herein. The computing device 702 may be, for example, a server of a service provider, a device associated with a client (e.g., a client device), an on-chip system, and/or any other suitable computing device or computing system.

The example computing device 702 as illustrated includes a processing system 704, one or more computer-readable media 706, and one or more I/O interface 708 that are communicatively coupled, one to another. The computing device may also include one or more heat transfer devices 124 as described herein. Although not shown, the computing device 702 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 704 is representative of functionality to perform one or more operations using hardware. Accordingly, the processing system 704 is illustrated as including hardware element 710 that may be configured as processors, functional blocks, and so forth. This may include implementation in hardware as an application specific integrated circuit or other logic device formed using one or more semiconductors. The hardware elements 710 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 706 is illustrated as including memory/storage 712. The memory/storage 712 represents memory/storage capacity associated with one or more computer-readable media. The memory/storage component 712 may include volatile media (such as random access memory (RAM)) and/or nonvolatile media (such as read only memory (ROM), Flash memory, optical disks, magnetic disks, and so forth). The memory/storage component 712 may include fixed media (e.g., RAM, ROM, a fixed hard drive, and so on) as well as removable media (e.g., Flash memory, a removable hard drive, an optical disc, and so forth). The computer-readable media 706 may be configured in a variety of other ways as further described below.

Input/output interface(s) 708 are representative of functionality to allow a user to enter commands and information to computing device 702, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 702 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 702. By way of example, and not limitation, computer-readable media may include "computer-readable storage media" and "computer-readable signal media."

"Computer-readable storage media" refers to media and/or devices that enable storage of information in contrast to mere signal transmission, carrier waves, or signals per se. Thus, computer-readable storage media does not include signal-bearing medium, transitory signals, or signals per se. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" refers to a signal-bearing medium that is configured to transmit instructions to the hardware of the computing device 702, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 710 and computer-readable media 706 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 710. The computing device 702 may be configured to implement particular instructions and/or functions corresponding to the software and/or hardware modules. Accordingly, implementation of a module that is executable by the computing device 702 as software may be achieved at least partially in hardware, e.g., through use of computer-readable storage media and/or hardware elements 710 of the processing system 704. The instructions and/or functions may be executable/operable by one or more articles of manufacture (for example, one or more computing devices 702 and/or processing systems 704) to implement techniques, modules, and examples described herein.

As further illustrated in FIG. 7, the example system 700 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 700, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link.

In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 702 may assume a variety of different configurations, such as for computer 714, mobile 716, and television 718 uses. Each of these configurations includes devices that may have generally different constructs and capabilities, and thus the computing device 702 may be configured according to one or more of the different device classes. For instance, the computing device 702 may be implemented as the computer 714 class of a device that includes a personal computer, desktop computer, a multi-screen computer, laptop computer, netbook, and so on.

The computing device 702 may also be implemented as the mobile 716 class of device that includes mobile devices, such as a mobile phone, portable music player, portable gaming device, a tablet computer, a multi-screen computer, and so on. The computing device 702 may also be implemented as the television 718 class of device that includes devices having or connected to generally larger screens in casual viewing environments. These devices include televisions, set-top boxes, gaming consoles, and so on.

The techniques described herein may be supported by these various configurations of the computing device 702 and are not limited to the specific examples of the techniques described herein.

Functionality may also be implemented all or in part through use of a distributed system, such as over a "cloud" 720 via a platform 722 as described below. The cloud 720 includes and/or is representative of a platform 722 for resources 724. The platform 722 abstracts underlying functionality of hardware (e.g., servers) and software resources of the cloud 720. The resources 724 may include applications and/or data that can be utilized while computer processing is executed on servers that are remote from the computing device 702. Resources 724 can also include services provided over the Internet and/or through a subscriber network, such as a cellular or Wi-Fi network.

The platform 722 may abstract resources and functions to connect the computing device 702 with other computing devices. The platform 722 may also serve to abstract scaling of resources to provide a corresponding level of scale to encountered demand for the resources 724 that are implemented via the platform 722. Accordingly, in an interconnected device embodiment, implementation of functionality described herein may be distributed throughout the system 700. For example, the functionality may be implemented in part on the computing device 702 as well as via the platform 722 that abstracts the functionality of the cloud 720.

Conclusion

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A heat transfer device comprising:
   a spring mechanism having a cutout to receive a cold plate, the cold plate configured to operate as a heat transfer surface for heat exchange with a heat-generating device;
   a spring bridge fastened to the spring mechanism and having a bridge portion assembled to span the cold plate with a gap between the cold plate and bridge portion, the spring bridge configured to apply contact pressure to the cold plate responsive to deformation of the spring mechanism caused by heat from the heat-generating device to affect engagement of the cold plate with the heat-generating device by closing of the gap; and
   the cold plate situated within the cutout and underneath the bridge portion of the spring bridge, the cold plate being unattached to the spring mechanism and the spring bridge.

2. A heat transfer device as described in claim 1, further comprising a heat-expelling device connected to the cold plate to convey heat away from the heat-generating device.

3. A heat transfer device as described in claim 2, wherein the heat-expelling device comprises a heat pipe configured to transfer heat using thermal conductivity.

4. A heat transfer device as described in claim 3, wherein the heat-expelling device is further connected to the spring mechanism and not connected to the spring bridge.

5. A heat transfer device as described in claim 1, wherein the cold plate comprises a thin metal conductive plate having a thickness of approximately 0.2 millimeters.

6. A heat transfer device as described in claim 1, wherein the heat transfer device when assembled has a thickness of approximately 0.5 millimeters or less.

7. A heat transfer device as described in claim 1, wherein the cutout of the spring mechanism matches a footprint of the cold plate.

8. A heat transfer device as described in claim 1, wherein a footprint of the cold plate is configured to overlap a surface of the heat-generating device with which the cold plate is designed to engage.

9. A heat transfer device as described in claim 1, wherein the heat-generating device is a processing system of a computing device.

10. A computing device comprising:
    a heat-generating device; and
    a heat transfer device arranged with the heat-generating device to conduct heat away from the heat-generating device, the heat transfer device including:
    a spring mechanism adapted to receive a cold plate, the cold plate configured to operate as a heat transfer surface for heat exchange with a heat-generating device;
    a spring bridge fastened to the spring mechanism and having a bridge portion assembled to span the cold plate with a gap between the cold plate and bridge portion, the spring bridge configured to apply contact pressure to the cold plate responsive to deformation of the spring mechanism caused by heat front the heat-generating device to close the gap and drive the cold plate into contact with the heat generating device;
    the cold plate situated underneath the bridge portion of the spring bridge, the cold plate being detached from the spring mechanism and the spring bridge;
    a heat-expelling device connected to the cold plate to convey heat away from the heat-generating device.

11. A computing device as described in claim 10, wherein the spring mechanism is configured to include a cutout that matches a footprint of the cold plate to receive the cold plate and allow the cold plate to contact the heat-generating device through the cutout when the contact pressure is applied via the spring bridge.

12. A computing device as described in claim 10, wherein the cold plate comprises a conductive plate having a thickness of less than 0.2 millimeters.

13. A computing device as described in claim 10, wherein the gap enables the cold plate to float relative to the spring mechanism such that the cold plate does not deform substantially when spring mechanism deforms.

14. A computing device as described in claim 10, wherein the heat-expelling device comprises a pair of heat pipes in thermal contact with the cold plate.

15. A computing device as described in claim 14, further comprising an additional spring bridge fastened to the spring mechanism and having an additional bridge portion configured to span the cold plate, the additional spring bridge and the spring bridge arranged at opposing ends of the spring mechanism such that both of said spring bridges operate to apply the contact pressure to the cold plate responsive to deformation of the spring mechanism.

16. A method comprising:

assembling a heat transfer device including:

arranging a spring mechanism for the heat transfer device having a cutout that matches a footprint of a cold plate for the heat transfer device connecting a heat-expelling device to both the spring mechanism and the cold plate such that the cold plate is positioned within the cutout formed in the spring mechanism but not attached directly to the spring mechanism; and fastening a spring bridge to the spring mechanism such that the spring bridge spans the cold plate with a gap formed between the spring bridge and the cold plate and is configured to close the gap and create contact pressure to drive the cold plate into contact with a heat-generating device responsive to deformation of the spring mechanism caused by heat from the heat-generating device, the spring bridge being detached from the cold plate and the heat-expelling device.

17. A method as described in claim 16, wherein the heat-expelling device comprises a heat pipe configured to transfer heat using thermal conductivity.

18. A method as described in claim 16, wherein the heat transfer device when assembled has a thickness of less than 0.5 millimeters.

19. A method as described in claim 16, further comprising installing the heat transfer device in a computing device to engage the heat-generating device integrated with the computing device to conduct heat away from the heat-generating device.

20. A method as described in claim 19, wherein the heat transfer device is installed such that the cold plate is directly over a surface of the heat-generating device with which the cold plate is designed to engage.

* * * * *